United States Patent
Yamamoto

(10) Patent No.: US 9,671,575 B2
(45) Date of Patent: Jun. 6, 2017

(54) OPTICAL WAVEGUIDE DEVICE AND METHOD OF MANUFACTURING THE SAME

(71) Applicant: SHINKO ELECTRIC INDUSTRIES CO., LTD., Nagano-shi, Nagano (JP)

(72) Inventor: Kazunao Yamamoto, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/098,670

(22) Filed: Apr. 14, 2016

(65) Prior Publication Data

US 2016/0313517 A1    Oct. 27, 2016

(30) Foreign Application Priority Data

Apr. 21, 2015   (JP) .................. 2015-086787

(51) Int. Cl.
| | |
|---|---|
| *G02B 6/12* | (2006.01) |
| *G02B 6/42* | (2006.01) |
| *G02B 6/122* | (2006.01) |
| *G02B 6/138* | (2006.01) |
| *H05K 1/02* | (2006.01) |
| *G02B 6/43* | (2006.01) |

(52) U.S. Cl.
CPC .......... *G02B 6/4214* (2013.01); *G02B 6/122* (2013.01); *G02B 6/138* (2013.01); *H05K 1/0274* (2013.01); *G02B 6/428* (2013.01); *G02B 6/4232* (2013.01); *G02B 6/43* (2013.01); *G02B 2006/12121* (2013.01); *G02B 2006/12123* (2013.01)

(58) Field of Classification Search
None
See application file for complete search history.

(56) References Cited

U.S. PATENT DOCUMENTS

| | | | |
|---|---|---|---|
| 6,243,509 B1 * | 6/2001 | Chen ................. | G02B 6/43 385/129 |
| 2003/0039455 A1 * | 2/2003 | Ouchi ................ | G02B 6/1221 385/88 |
| 2013/0330049 A1 * | 12/2013 | Yanagisawa ....... | G02B 6/42 385/88 |
| 2014/0119702 A1 | 5/2014 | Yamamoto | |
| 2015/0147023 A1 * | 5/2015 | Yamamoto ......... | G02B 6/12 385/14 |

FOREIGN PATENT DOCUMENTS

| | | |
|---|---|---|
| JP | 2014-89262 | 5/2014 |
| WO | 02/073256 | 9/2002 |

* cited by examiner

*Primary Examiner* — Mike Stahl
(74) *Attorney, Agent, or Firm* — Rankin, Hill & Clark LLP

(57) ABSTRACT

An optical waveguide device includes a wiring board; an optical waveguide having a first cladding layer, a core layer and a second cladding layer formed in this order on the wiring board; an optical path conversion mirror formed in the core layer; and an optical element mounted on the second cladding layer, the optical element comprising a light emitting portion or a light receiving portion protruding from a lower side thereof. The second cladding layer has an opening formed above the optical path conversion mirror. The optical element is mounted on the second cladding layer so that at least one end thereof is positioned above the opening of the second cladding layer. The light emitting portion or light receiving portion of the optical element is arranged the opening of the second cladding layer.

3 Claims, 16 Drawing Sheets

(PLAN VIEW)

(PLAN VIEW)

(PLAN VIEW)

(PLAN VIEW)

(PLAN VIEW)

(PLAN VIEW)

(PLAN VIEW)

(PLAN VIEW)

OPTICAL WAVEGUIDE DEVICE AND METHOD OF MANUFACTURING THE SAME

CROSS-REFERENCE TO RELATED APPLICATION

The present application claims priority from Japanese Patent Application No. 2015-086787 filed on Apr. 21, 2015, the entire content of which is incorporated herein by reference.

BACKGROUND

Technical Field

The present invention relates to an optical waveguide device and a method of manufacturing the same.

Related Art

In general, optical waveguide devices have been known in which an optical waveguide configured to treat an optical signal is formed on a wiring board configured to treat an electric signal. The optical waveguide devices are a photo-electric composite substrate, and can transmit a high-speed part with the optical signal so as to make up for a limit of a transmission speed of the electric signal.

An optical path conversion mirror is arranged on an end side of the optical waveguide, and an optical element is mounted on the wiring board to be optically coupled to the optical path conversion mirror of the optical waveguide.

Patent Document 1: Japanese Patent Application Publication No. 2014-89262

Patent Document 2: WO2002/073256

As described below with respect to a preliminary matter, if an optical element having a light emitting portion protruding downward is mounted on a cladding layer of an optical waveguide, the light emitting portion of the optical element pushes down the cladding layer and thus an optical path conversion mirror.

Accordingly, the optical path conversion mirror of the optical waveguide is likely to be deformed so that an inclination angle thereof is misaligned. As a result, an optical-coupling characteristic between the light emitting element and the optical path conversion mirror is deteriorated and thus a high reliability cannot be achieved.

SUMMARY

Exemplary embodiments of the invention provide an optical waveguide device having a structure, which allows an optical element having a light emitting portion or light receiving portion protruding downward to be reliably mounted, and a method of manufacturing the same.

An optical waveguide device according to an exemplary embodiment of the invention comprises:

a wring board;

an optical waveguide having a first cladding layer, a core layer and a second cladding layer formed in this order on the wiring board;

an optical path conversion mirror formed in the core layer; and an optical element mounted on the second cladding layer, the optical element comprising a light emitting portion or a light receiving portion protruding from a lower side thereof. The second cladding layer has an opening formed above the optical path conversion mirror. The optical element is mounted on the second cladding layer so that at least one end thereof is positioned above the opening of the second cladding layer. The light emitting portion or light receiving portion of the optical element is arranged the opening of the second cladding layer.

A method of manufacturing an optical waveguide device, according to an exemplary embodiment of the invention, comprises:

preparing a wiring board;

forming a first cladding layer on the wiring board;

forming a core layer on the first cladding layer;

forming an optical path conversion mirror on the core layer;

forming a second cladding layer having an opening above the optical path conversion mirror on the first cladding layer and the core layer;

preparing an optical element having a light emitting portion or light receiving portion protruding from a lower side thereof; and mounting the optical element on the second cladding layer so that the light emitting portion or light receiving portion is arranged inside the opening of the second cladding layer and also at least one end of the optical element is positioned above the opening.

According to the following present invention, the optical waveguide device has the optical waveguide having the first cladding layer, the core layer and the second cladding layer formed in this order on the wiring board. The optical path conversion mirror formed in the core layer.

Also, the opening is formed in the second cladding layer and above the optical path conversion mirror. In addition, the optical element having the light emitting portion or light receiving portion protruding downward is mounted on the second cladding layer and the light emitting portion or light receiving portion is arranged inside the opening of the second cladding layer.

Accordingly, the light emitting portion or light receiving portion of the optical element does not push down the second cladding layer of the optical waveguide and thus there is no risk that the optical path conversion mirror is deformed so that an inclination angle thereof is misaligned. Therefore, a higher reliability in optical coupling between the optical element and the optical path conversion mirror can be ensured.

Also, one end of the optical element is positioned above the opening and thus the underfill resin can be easily filled into the opening.

DETAILED DESCRIPTION

Hereinafter, embodiments will be described with reference to the accompanying drawings.

Figure 1A:
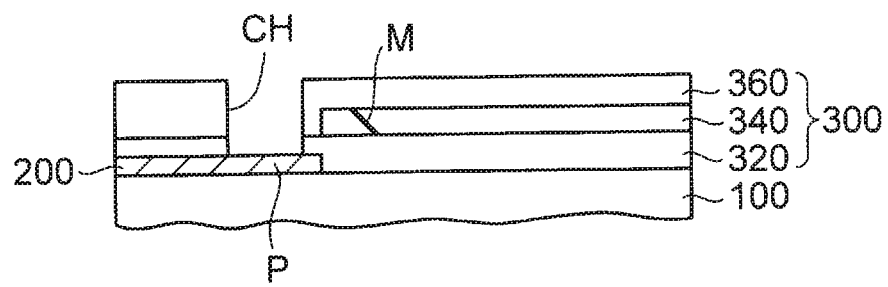
FIGS. 1A to 1C are sectional views explaining problems of an optical waveguide device according to the preliminary matter.

Prior to explaining the present embodiments, the preliminary matter, which is the foundation thereof, will be described. As shown in FIG. 1A, an optical waveguide device according to the preliminary matter includes an optical waveguide 300 arranged on a wiring board 100 having a wiring layer 200. The optical waveguide 300 has a structure in which a core layer 340 is surrounded by a first cladding layer 320 and a second cladding layer 360.

An optical path conversion mirror M is provided on an end of the core layer 340. Also, contact holes CH are formed in the first cladding layer 320 and the second cladding layer 360 to reach respective connection pads P of the wiring layer 200.

Figure 1B:
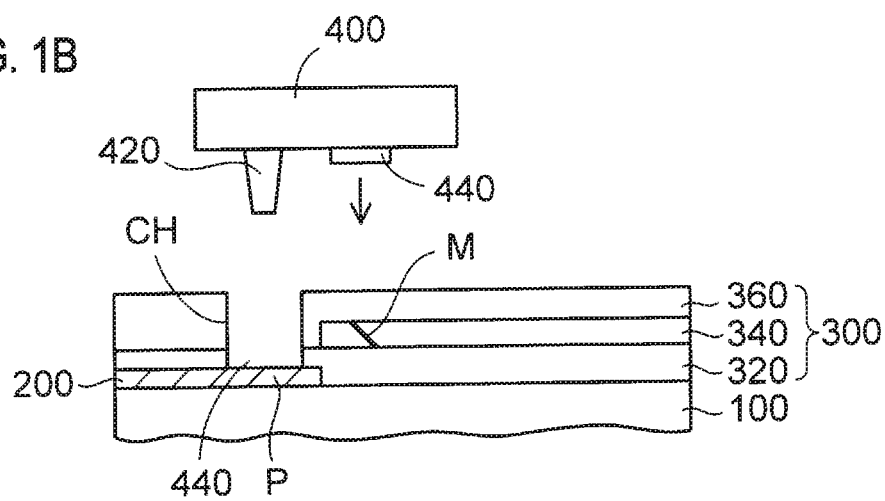
Figure 1C:
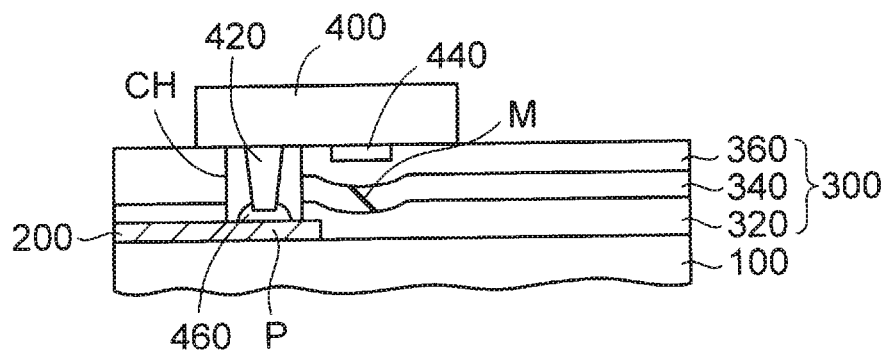

Also, as shown in FIG. 1B, a light emitting element 400 as an optical element is prepared. The light emitting element 400 has connection terminals 420 and a light emitting portion 440 on a lower side thereof. The light emitting portion 440 of the light emitting element 400 is formed to protrude downward from a lower surface of a main body thereof. A protruding height of the light emitting portion 440 of the light emitting element 400 is about 2 μm to 5 μm.

Further, the connection terminals 420 of the light emitting element 400 are arranged in the contact holes CH of the wiring board 100 and then connected to the connection pads P of the wiring layer 200 via solders 460. Thus, the light emitting portion 440 of the light emitting element 400 is optically coupled to the optical path conversion mirror M of the optical waveguide 300.

A height of the connection terminals 420 of the light emitting element 400 is set to such an extent that, when the light emitting element 400 is mounted, the lower surface of the main body of the light emitting element 400 comes in contact with an upper surface of the second cladding layer 360.

At this time, because the light emitting portion 440 of the light emitting element 400 protrudes from the lower surface of the main body, the light emitting portion 440 of the light emitting element 400 pushes down the second cladding layer 360. Accordingly, there is a case where the second cladding layer 360 and the underlying optical path conversion mirror M are deformed so that an inclination angle of the optical path conversion mirror M is misaligned.

As a result, an optical-coupling characteristic between the light emitting element 400 and the optical path conversion mirror M is deteriorated and thus a high reliability cannot be achieved.

In addition, when the light emitting element 400 is mounted by means of reflow heating, the light emitting portion 440 of the heated light emitting element 400 comes closer to the optical path conversion mirror M in a state where the light emitting portion 440 is in contact with the second cladding layer 360. Accordingly, there is a concern that a light reflection characteristic of the optical path conversion mirror M is deteriorated due to influence of heat.

Even in a case where a light receiving element is mounted, the same problem is occurred because a light receiving portion of the light receiving element protrudes from a lower surface of a main body thereof.

Embodiments described below can solve the above problems.

Embodiment

Figure 9A:
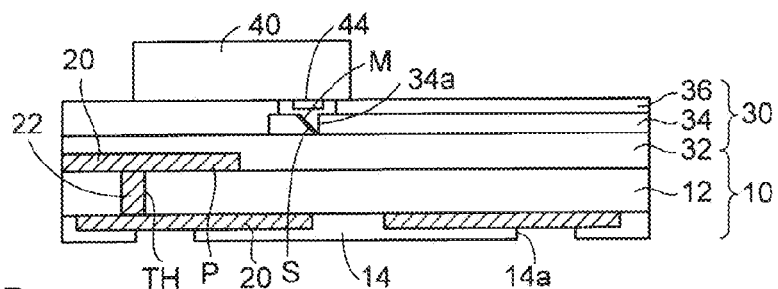
FIGS. 9A to 9C are sectional views and a plan view showing the method of manufacturing the optical waveguide device according to the embodiment (the seventh step thereof).
Figure 9B:
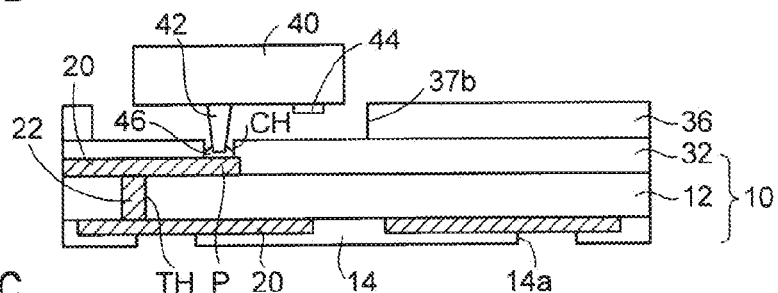
Figure 9C:
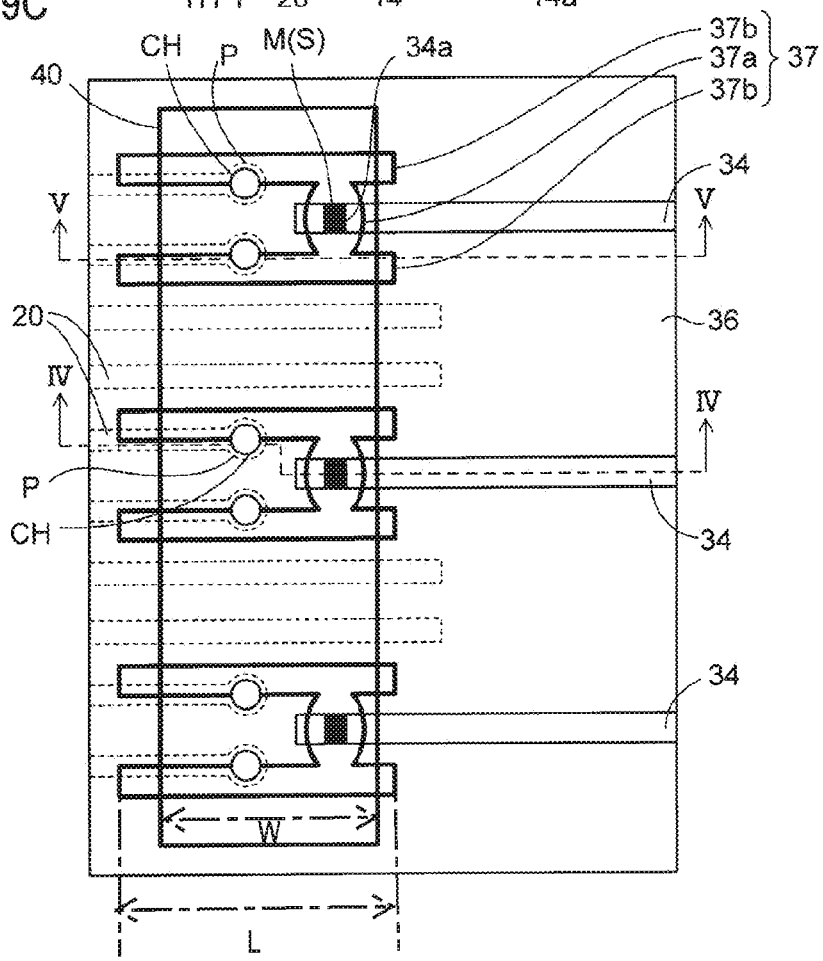
Figure 10A:
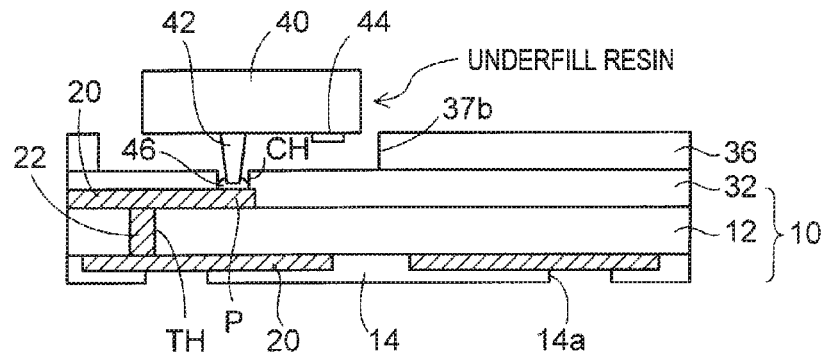
FIGS. 10A and 10B are a sectional view and a plan view showing the method of manufacturing the optical waveguide device according to the embodiment (the eighth step thereof).
Figure 10B:
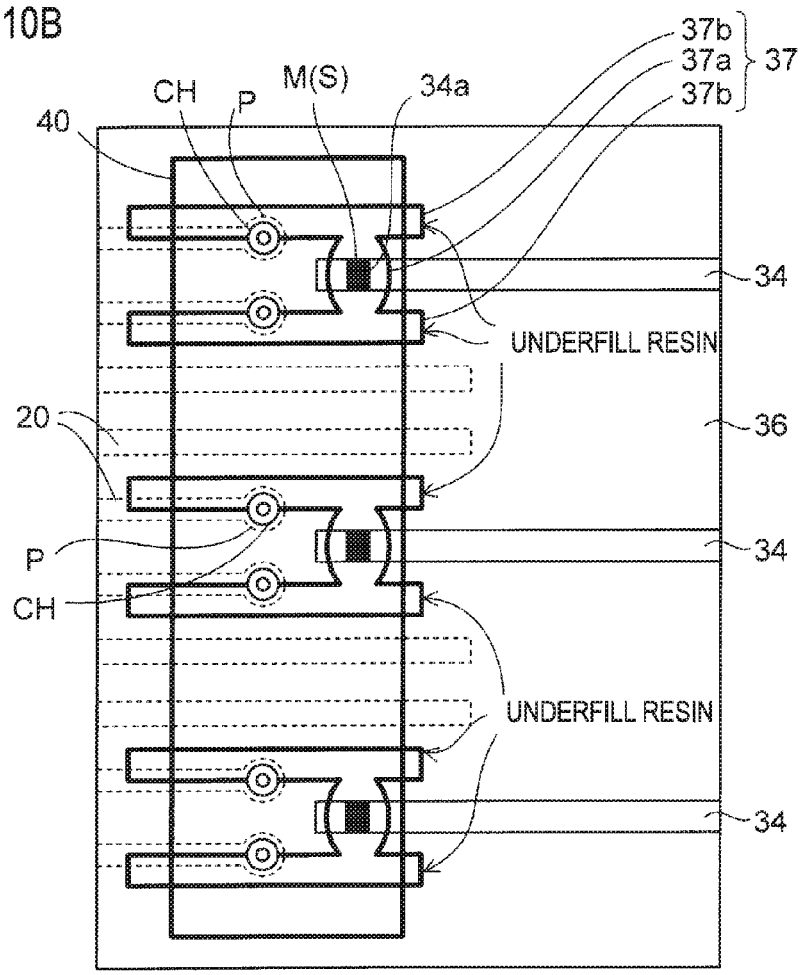
Figure 11A:
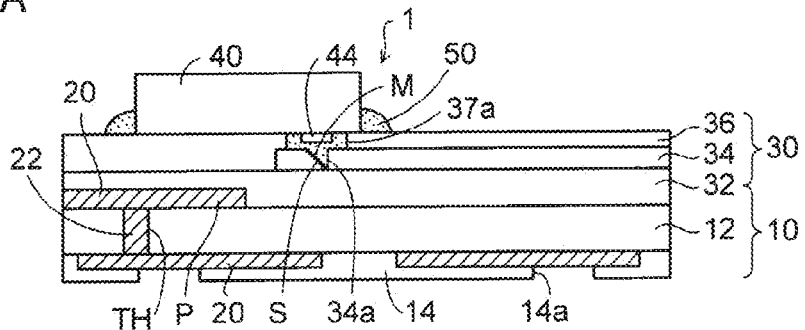
FIGS. 11A to 11C are sectional views and a plan view showing the optical waveguide device according to the embodiment.
Figure 11B:
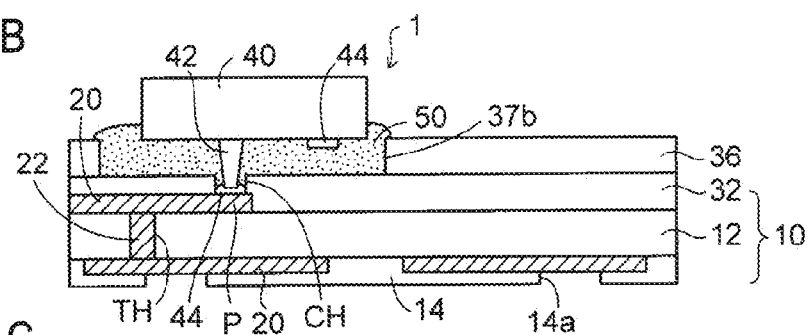
Figure 11C:
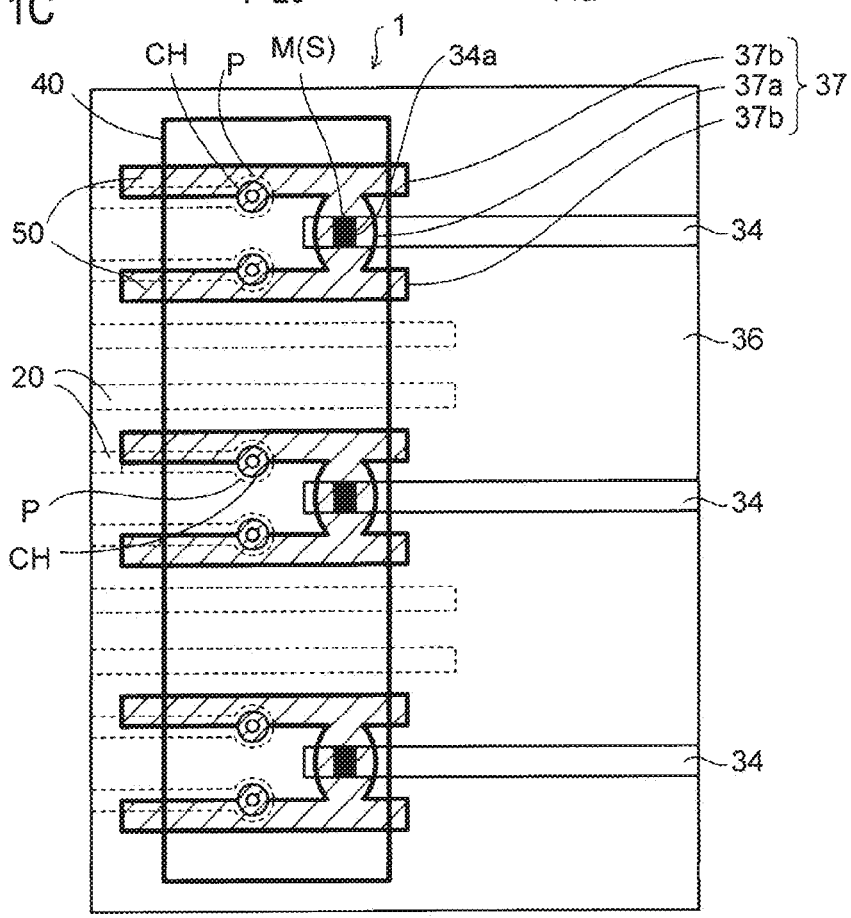

FIGS. 2A to 10B are views showing a method of manufacturing an optical waveguide device according to the embodiment and FIGS. 11A to 11C are views showing the optical waveguide device according to the embodiment. In the following, the method of manufacturing the optical waveguide device will be described together a structure of the optical waveguide device.

Figure 2A:
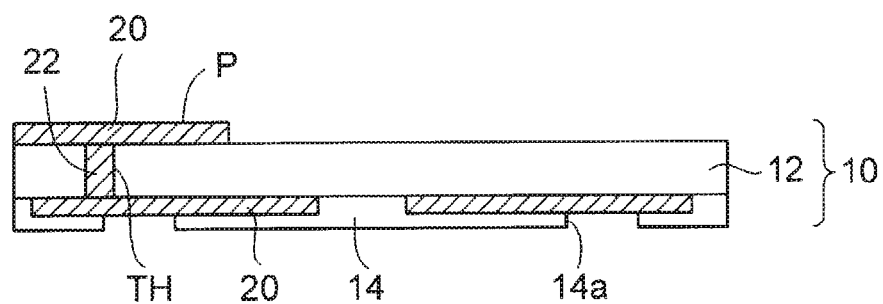
FIGS. 2A and 2B are sectional views showing a method of manufacturing an optical waveguide device according to an embodiment (the first step thereof).

In the method of manufacturing the optical waveguide device according to the embodiment, a wiring board 10 as shown in FIG. 2A is first prepared. The wiring board 10 has wiring layers 20 respectively formed on both surfaces of a substrate 12.

The substrate 12 is provided with a through-hole TH extending therethrough in a thickness direction, and a through-electrode 22 is filled in the through-hole TH. The wiring layers 20 on both surfaces are connected to each other via the through-electrode 22. The wiring layer 20 on an upper surface side of the substrate 12 has connection pads P on one end thereof.

Also, on a lower surface side of the substrate 12, a solder resist layer 14 provided with an opening 14a above a connection portion of the corresponding wiring layer 20 is formed.

Alternatively, the wiring layers 20 on both surfaces may be connected to each other via a through-hole plating layer formed on a side wall of the through-hole TH, and the remaining hole of the through-hole TH may be filled with resin.

Also, the substrate 12 may be a rigid substrate or flexible substrate. In a case of the rigid substrate, the substrate 12 is formed, for example, of a glass epoxy resin or the like.

Alternatively, in a case of the flexible substrate, the substrate 12 is formed, for example, of a polyimide film or the like. Also, the number of wiring layers 20 to be stacked on both surfaces of the substrate 12 can be arbitrarily set.

The through-hole TH of the wiring board 10 is formed by drilling, laser and the like, and the wiring layers 20 on both surface and the through-electrode 22 are formed using photolithography, plating technique and the like.

Subsequently, as shown in FIG. 2A, a photosensitive resin layer (not shown) for obtaining a first cladding layer is formed in an optical waveguide forming region on the wiring board 10 and then exposure and development is performed on the basis of photolithography.

Then, the photosensitive resin layer is cured by a heating treatment at a temperature of about 100° C. to 140° C. Thus, the first cladding layer 32 is formed in the optical waveguide forming region on the wiring board 10. For example, a thickness of the first cladding layer 32 is about 10 µm to 30 µm.

As the photosensitive resin layer, a UV curable epoxy resin or the like can be suitably employed. As a method of forming the photosensitive resin layer, a semi-cured (B-stage) photosensitive resin sheet may be bonded or a liquid photosensitive resin may be applied.

Also in steps of forming core layers and a second cladding layer as described below, the same resin is suitably employed.

Figure 3A:
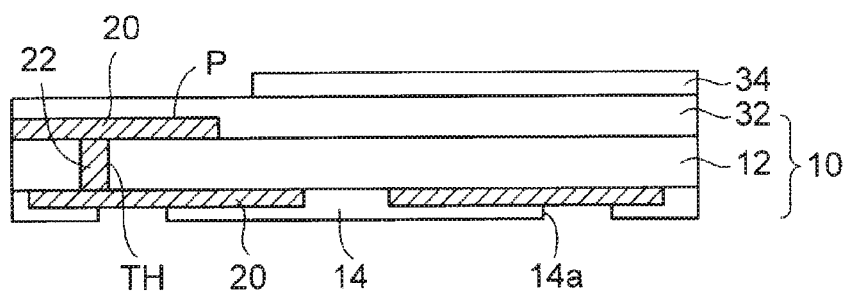
FIGS. 3A and 3B are a sectional view and a plan view showing the method of manufacturing the optical waveguide device according to the embodiment (the second step thereof).

Subsequently, as shown in FIG. 3A, a photosensitive resin layer (not shown) for obtaining core layers is formed on the first cladding layer 32. Also, after performing exposure and development on the basis of photolithography, the photosensitive resin layer is cured by a heating treatment at temperatures of 100° C. to 140° C. Thus, the core layers 34 are formed on the first cladding layer 32.

Figure 3B:
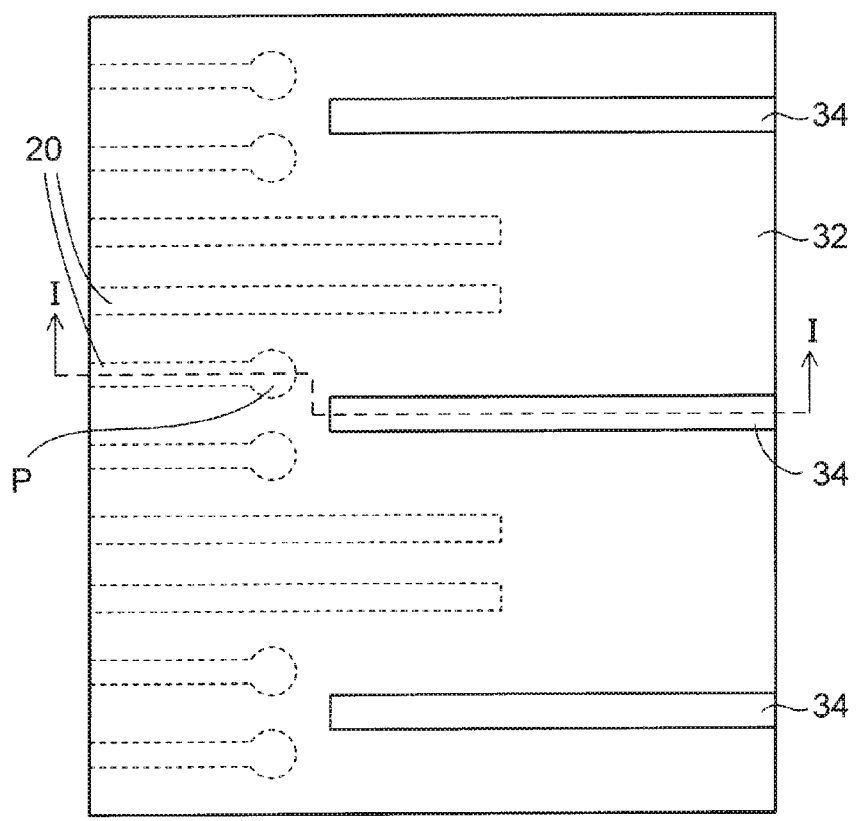

At this time, as shown in a plan view of FIG. 3B, the core layers 34 on the first cladding layer 32 are formed in a pattern where a plurality of stripes are arranged side by side. A width of the core layers 34 is set to about 30 µm to 40 µm and a thickness of the core layers 34 is set to about 30 µm to 80 µm.

FIG. 3A corresponds to a sectional view taken along a broken line I-I in the plan view of FIG. 3B. The same is also applied to FIGS. 4A to 5B as described below.

Figure 4A:
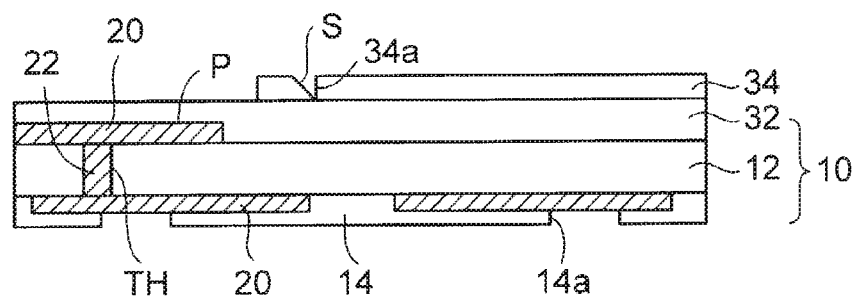
FIGS. 4A and 4B are a sectional view and a plan view showing the method of manufacturing the optical waveguide device according to the embodiment (the third step thereof).
Figure 4B:
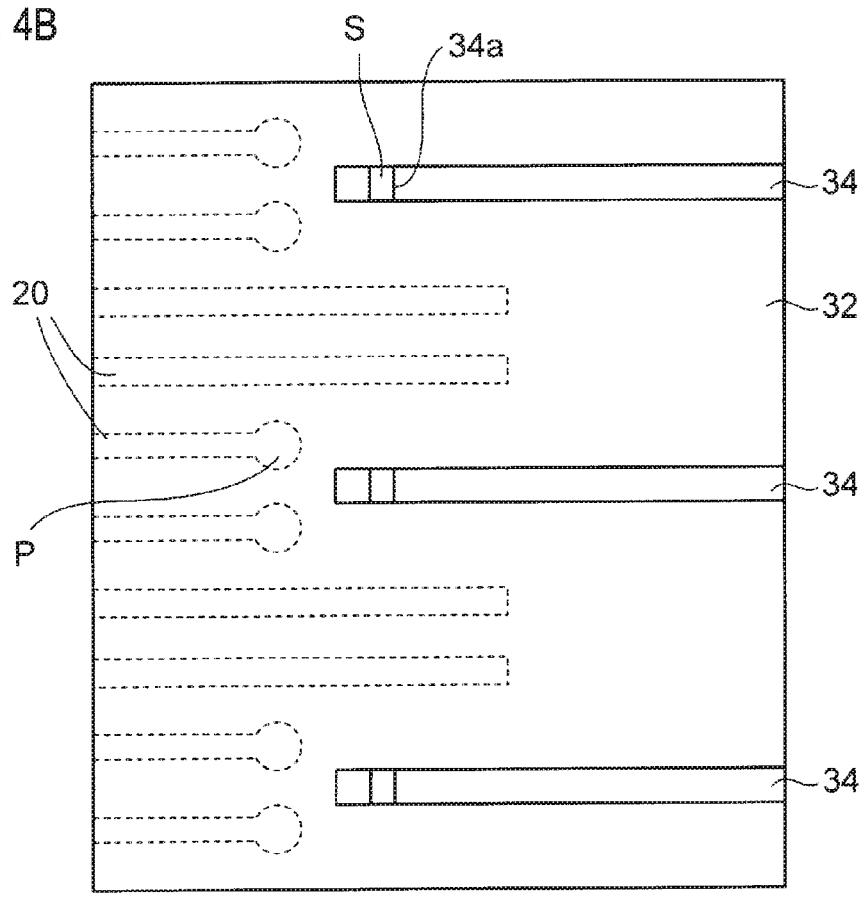

Subsequently, as shown in FIGS. 4A and 4B, portions on both ends of each core layer 34 on which optical path conversion mirrors are respectively to be arranged are cut in a thickness direction by a rotary blade of a cutting apparatus. It should be noted that a region on one end side of the core layer 34 is partially shown in FIGS. 4A and 4B.

In this way, a V-shaped cutout portion 34a having an optical path conversion inclined surface S for converting an optical path by 90° is formed. The optical path conversion inclined surface S is preferably formed to be inclined at angle of 45° relative to the surface of the wiring board 10. Instead of cutting, the cutout portion 34 having the optical path conversion inclined surface S may be formed by laser or the like.

In addition, the cutout portion 34a is preferably formed to be cut through the core layer 34, but may be formed to extend to a middle of a thickness of the first cladding layer 32.

Figure 5A:
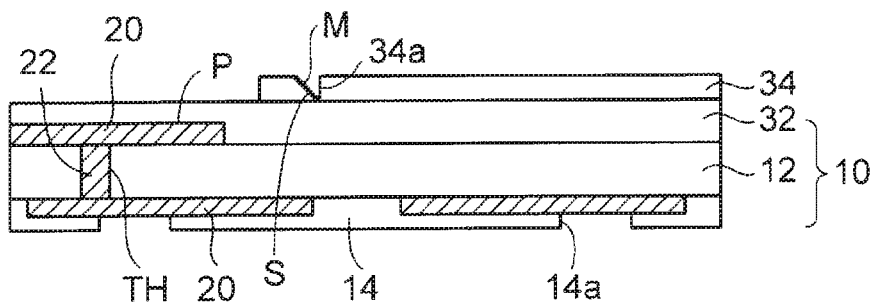
FIGS. 5A and 5B are a sectional view and a plan view showing the method of manufacturing the optical waveguide device according to the embodiment (the fourth step thereof).
Figure 5B:
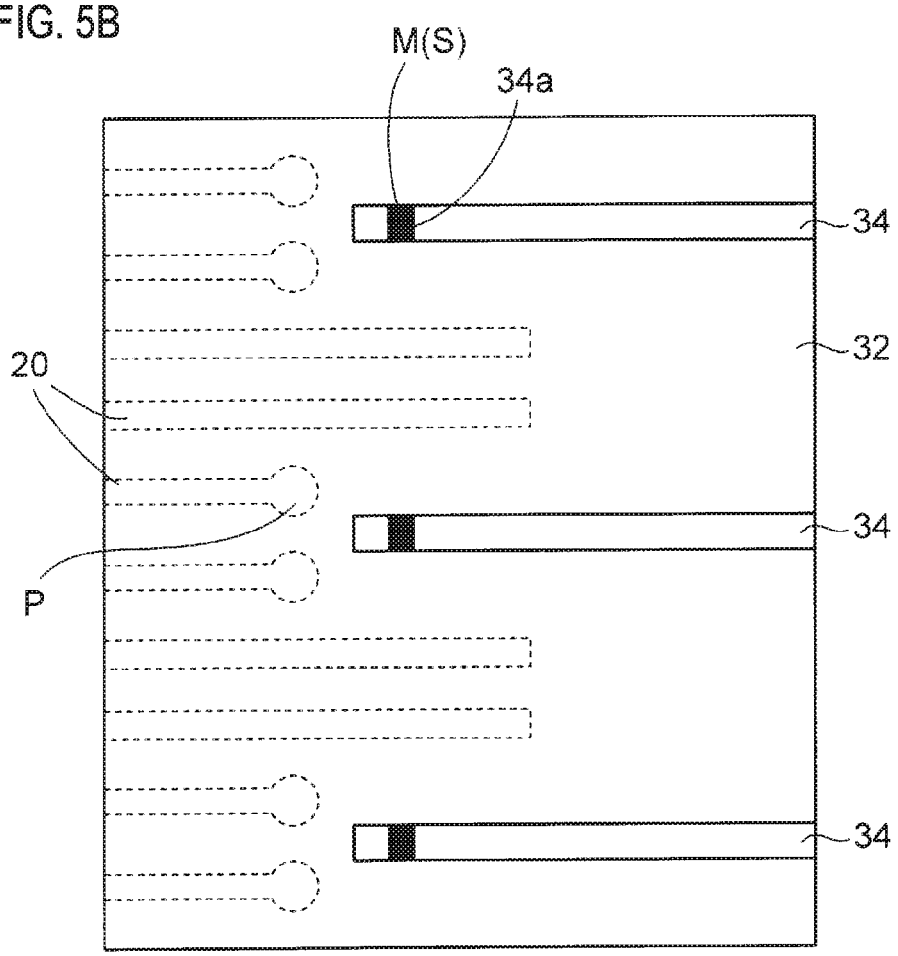

Subsequently, as shown in FIGS. 5A and 5B, a light reflective metal layer is partially formed on the optical path conversion inclined surface S of the cutout portion 34a of the core layer 34, thereby obtaining an optical path conversion mirror M. As the light reflective metal, gold, aluminum or the like is employed.

Figure 6A:
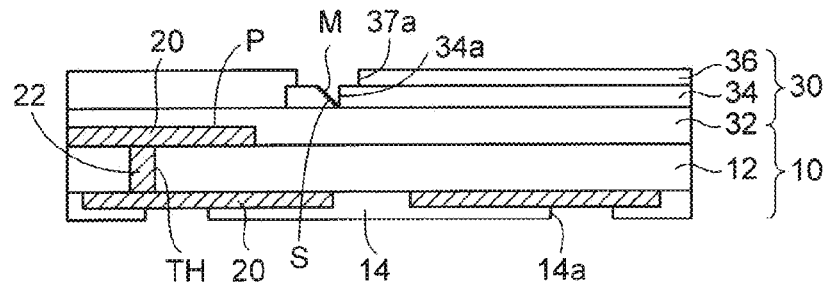
FIGS. 6A to 6C are sectional views and a plan view showing the method of manufacturing the optical waveguide device according to the embodiment (the fifth step thereof).

Subsequently, a method of patterning a second cladding layer 36 on the first cladding layer 32 and the core layers 34 will be described with reference to FIGS. 6A to 6C. FIG. 6A corresponds to a sectional view taken along a broken line in a plan view of FIG. 6C. Also, FIG. 6B corresponds to a sectional view taken along a broken line III-III in the plan view of FIG. 6C.

The same is applied to FIGS. 7A to 7C as described below. Also, the plan view of FIG. 6C is depicted in a see through manner and the same is also applied to the following plan views.

As shown in FIG. 6A, a photosensitive resin layer (not shown) for obtaining a second cladding layer is formed on the first cladding layer 32 and the core layers 34. Also, after performing exposure and development on the basis of photolithography, the photosensitive resin layer is cured by a heating treatment at temperatures of 100° C. to 140° C.

Thus, the second cladding layer 36 is formed on the first cladding layer 32 to cover the core layers 34. For example, a thickness of the second cladding layer 36 is about 10 µm to 30 µm.

Figure 6B:
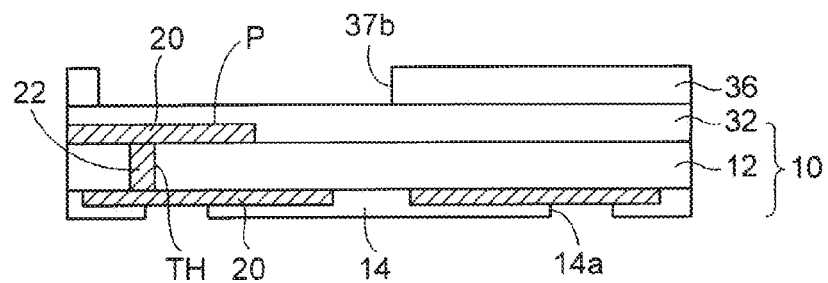
Figure 6C:
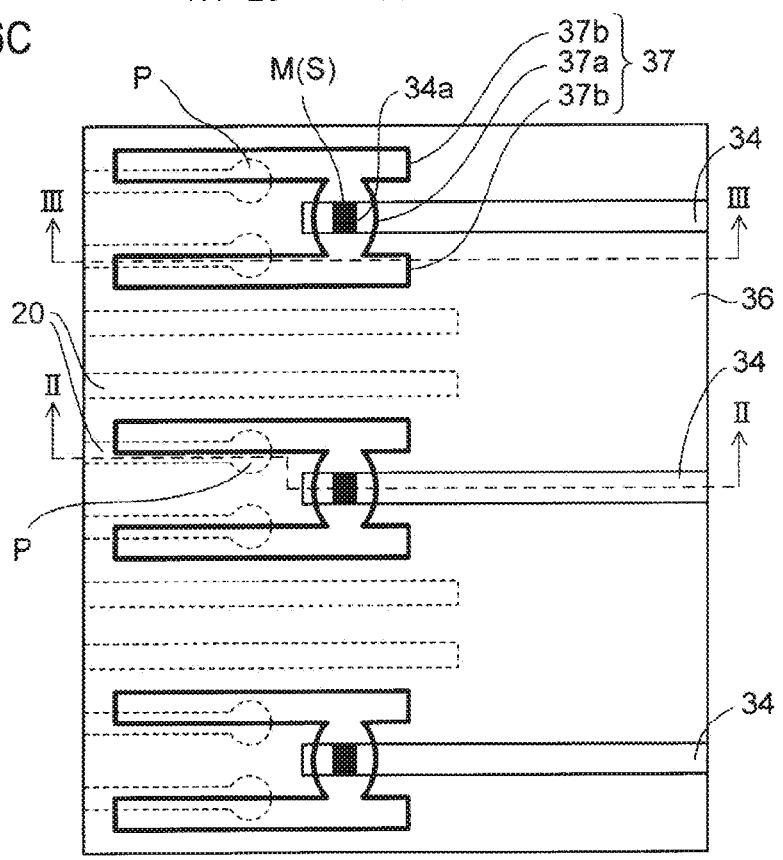

Referring to FIG. 6A together with FIG. 6C, at this time, the second cladding layer 36 is patterned to have openings 37 arranged in required portions. Each opening 37 of the second cladding layer 36 is formed by a first elliptical opening 37a and second elongated rectangular openings 37b respectively connected to both ends of the first opening 37a.

The first opening 37a of the second cladding layer 36 is arranged above a region including the optical path conversion mirror M formed in the respective core layer 34. The first opening 37a of the second cladding layer 36 is intended to prevent a protruding light emitting portion of a light emitting element from being abutted against the second cladding layer 36 so that when the light emitting element as an optical element is mounted thereon as described below.

Accordingly, an area of the first opening 37a of the second cladding layer 36 is set to be larger than an area of the light emitting portion of the light emitting element. Also, a depth of the first opening 37a as measured to an upper layer of the core layer 34 is set to be deeper than a protruding height of the light emitting portion of the light emitting element.

The two second openings 37b connected to both ends of the first opening 37a are respectively arranged above regions including the connection pads P of the wiring board 10. The second openings 37b of the second cladding layer 36 are sufficient so long as being arranged above regions including at least a part of the respective connection pads P.

The second opening 37b of the second cladding layer 36 serve as flow paths for supplying an underfill resin into contact holes after connection terminals of the light emitting element are connected to the connection pads P in the contact holes as described below.

Accordingly, the second openings 37b of the second cladding layer 36 are arranged to be communicated with the respective contact holes CH arranged above the connection pads P.

Also, a length of the second openings 37b of the second cladding layer 36 is set to be longer than a width of the light emitting element to be mounted, so that when the light emitting element is mounted, parts of the second openings 37b of the second cladding layer 36 are exposed outside thereof.

In the example of the plan view of FIG. 6C, a diameter of the connection pads P of the wiring layer 20 is set to be larger than a width of the second openings 37b of the second cladding layer 36. For example, the diameter of the connection pads P of the wiring layer 20 is 60 µm to 80 µm and the width of the second openings 37b of the second cladding layer 36 is about 30 µm to 40 µm.

Accordingly, in the example of the plan view of FIG. 6C, the second openings 37b of the second cladding layer 36 are arranged above the respective connection pads P so that parts of the connection pads P extend further outward relative to a side wall of the respective second openings 37b.

Alternatively, the diameter of the connection pads P may be set to be smaller than the width of the second openings 37b of the second cladding layer 36, so that the whole of each connection pad P is arranged in the respective second opening 37b of the second cladding layer 36.

Figure 7A:
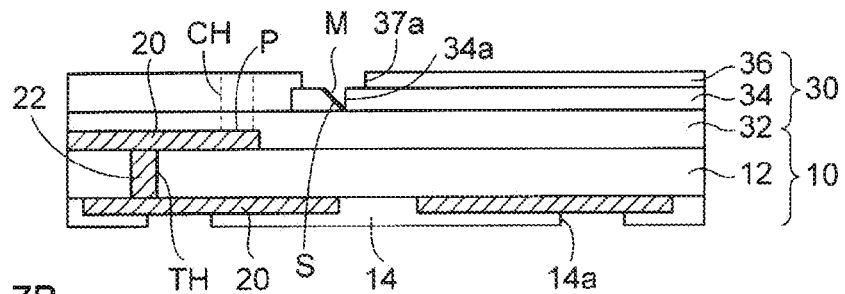
FIGS. 7A to 7C are sectional views and a plan view showing the method of manufacturing the optical waveguide device according to the embodiment (the sixth step thereof).
Figure 7B:
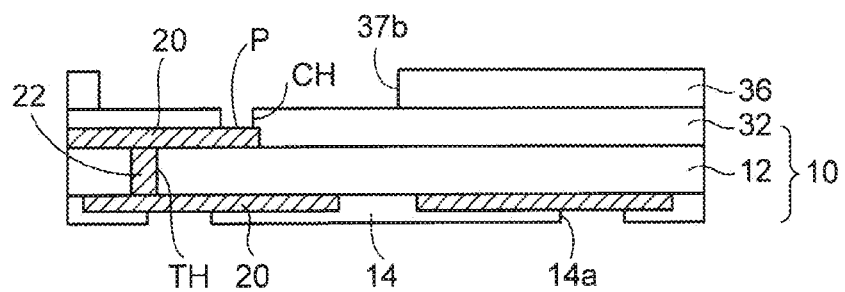
Figure 7C:
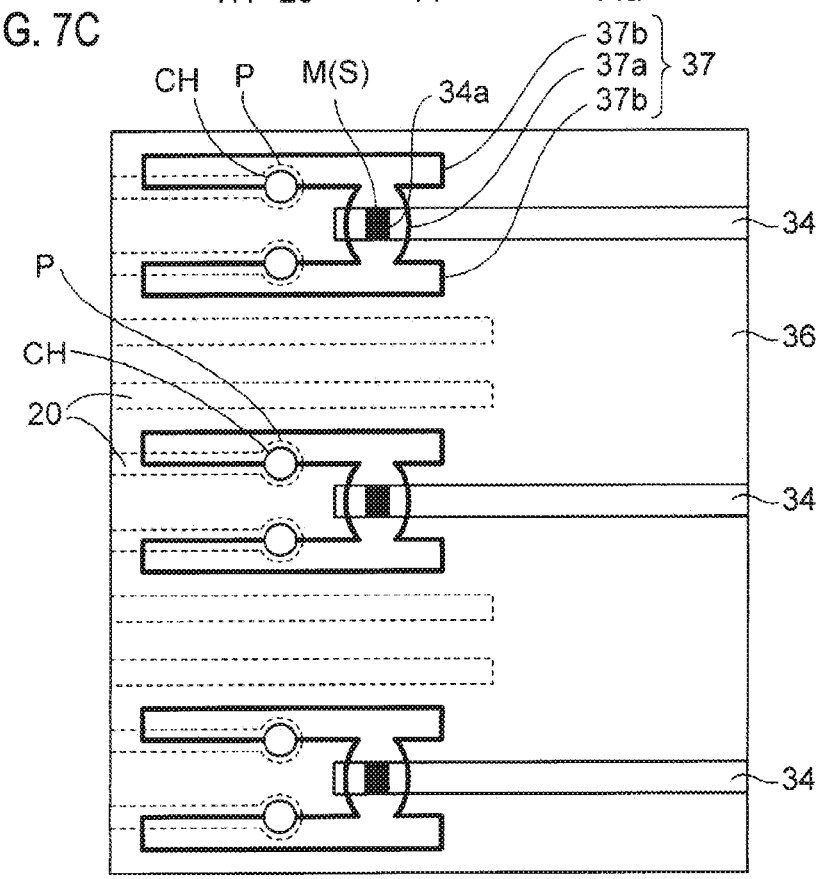

Subsequently, as shown in FIGS. 7A to 7C, the second cladding layer 36 and the first cladding layer 32 are processed by laser, so that contact holes CH are formed to reach the respective connection pads P of the wiring layer 20 of the wiring board 10.

As shown in FIG. 7C, each contact hole CH is arranged above the respective connection pad P in a state where the contact hole CH extends further outward relative to the side wall of the respective second opening 37b of the second cladding layer 36. The contact hole CH is formed to be communicated with the second opening 37b of the second cladding layer 36.

Thus, as shown in FIG. 7A, an optical waveguide 30 having the first cladding layer 32, the core layers 34 and the second cladding layer 36 formed in this order from below is obtained on the wiring board 10.

Meanwhile, according to the manufacturing method of FIGS. 6A to 7C as described above, after forming the openings 37 in the second cladding layer 36 on the basis of photolithography, the second cladding layer 36 and the first cladding layer 32 are opened by laser, thereby forming the contact holes CH.

Figure 2B:
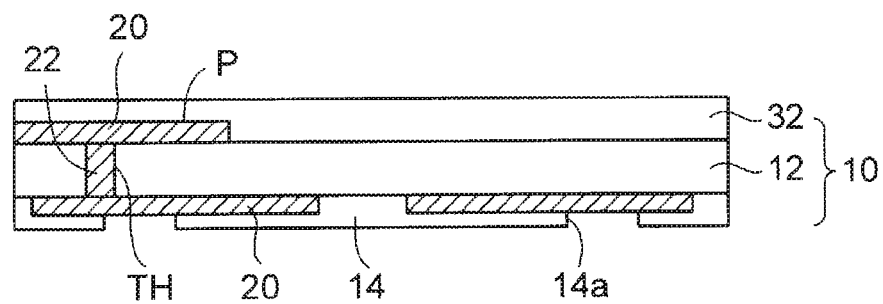
Figure 8A:
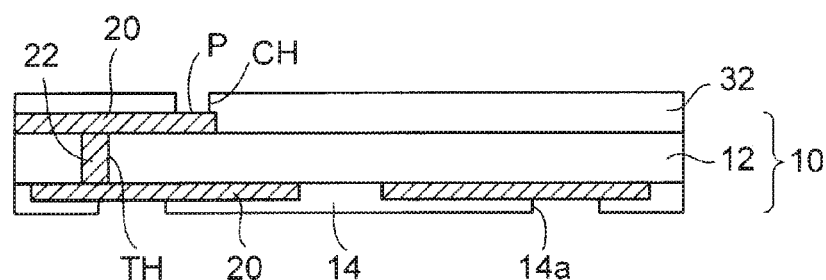
FIGS. 8A and 8B are sectional views showing another method for obtaining a structure of FIG. 7B.

Instead of this manufacturing method, as shown in FIG. 8A, the contact holes CH may be simultaneously formed in the first cladding layer 32 on the basis of photolithography during the step of FIG. 2B as described above. Alternatively, after the step of FIG. 2B as described above, the contact holes CH may be formed in the first cladding layer 32 by laser.

Figure 8B:
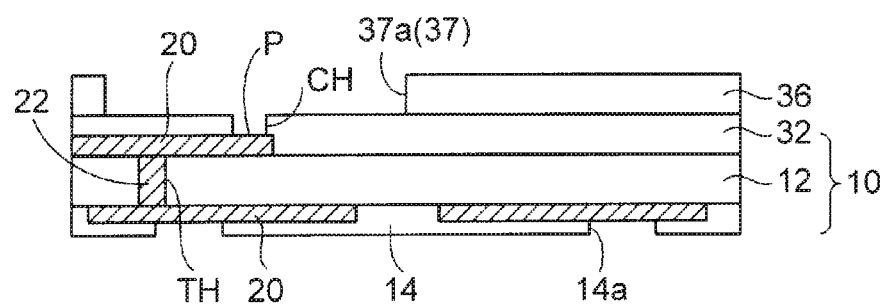

Then, as shown in FIG. 8B, during the step of FIG. 6B as described above, the first and second openings 37a and 37b are formed in the second cladding layer 36 to be communicated with the contact holes CH. In this way, an optical waveguide 30 having the same structure as that of FIGS. 7A and 7B can be obtained.

In this method, a portion of each second opening 37b of the second cladding layer 36, which is located above the region of the respective contact hole CH, is formed to protrude outward in a semi-circular shape and thus to define a side wall of the contact hole CH.

Next, a method of mounting an optical element on the structure of FIGS. 7A to 7C as described above will be described with reference to FIGS. 9A to 9C. A light emitting element or a light receiving element can be used as the optical element, but the light emitting element will be described by way of example.

Like FIGS. 6A to 6C as described above, FIG. 9A corresponds to a sectional view taken along a broken line of a plan view of FIG. 9C. FIG. 9B corresponds to a sectional view taken along a broken line V-V of the plan view of FIG. 9C. The same is also applied to FIGS. 10A to 11C as described below. Also, FIG. 9C is depicted in a see through manner.

As shown in FIGS. 9A and 9B, a light emitting element 40 having connection terminals 42 and a light emitting portion 44 on a lower surface thereof is prepared. The connection terminals 42 are formed by a bump electrode such as a gold bump. Also, the light emitting portion 44 is formed to protrude downward from the lower surface of the main body of the light emitting element 40. A protruding height of the light emitting portion 44 of the light emitting element 40 is about 2 µm to 5 µm.

Then, the connection terminals 42 of the light emitting element 40 are arranged on the connection pads P inside the contact holes CH and then are connected thereto by solders 46 by means of reflow heating.

Thus, the light emitting portion 44 of the light emitting element 40 is optically coupled to the optical path conversion mirror M of the respective core layer 34.

At this time, because the first opening 37a is arranged in a portion of the second cladding layer 36 located below the light emitting portion 44 of the light emitting element 40, the protruding light emitting portion 44 of the light emitting element 40 is received in the first opening 37a of the second cladding layer 36. Thus, the problem that the light emitting portion 44 of the light emitting element 40 pushes down the second cladding layer 36 so that the optical path conversion mirror M is deformed can be solved.

Also, the light emitting portion 44 of the light emitting element 40 comes closer to the optical path conversion mirror M by the height thereof protruding from the main body, thereby enhancing optical characteristics.

Further, when the light emitting element 40 is connected to the connection pads P by means of reflow heating, the light emitting portion 44 of the heated light emitting element 40 does not come in contact with the second cladding layer 36. Thus, deterioration of the optical path conversion mirror M due to influence of heat from the light emitting element 40 can be prevented.

Further, at this time, referring to the plan view of FIG. 9C, a length L of the second opening portions 37b of the second cladding layer 36 communicated with the contact holes CH is set to be longer than a width W of the light emitting element 40 as described above. Accordingly, if the light emitting element 40 is mounted, parts of both end sides of the second openings 37b of the second cladding layer 36 are exposed outside the light emitting element 40.

In this way, at least one end of the light emitting element 40 is positioned above the second openings 37b of the second cladding layer 36. In other words, when viewed from above (in the plan view), at least one end of the light emitting element 40 is arranged inside the second openings 37b of the second cladding layer 36.

Also, a height of the connection terminals 42 of the light emitting element 40 is set to be lower than a height as measured from a surface of the connection pad P, which is located on the bottom of the contact hole CH, to the top end of the second opening 37b of the second cladding layer 36. Accordingly, as shown in FIG. 9A, the lower surface of the light emitting element 40, except the light emitting portion 44, is abutted against the upper surface of the second cladding layer 36 so that a height position of the light emitting element 40 can be defined, thereby achieving an optimal parallelization.

In this way, in a state where the lower surface of the light emitting element 40 is in contact with the upper surface of the second cladding layer 36, the second openings 37b which serve as flow paths for an underfill resin are arranged to be exposed outside the light emitting element 40.

Subsequently, as shown in FIGS. 10A and 10B, a liquid underfill resin is applied all at once to the vicinity of side surfaces of the light emitting element 40 by a dispenser or the like. At this time, because the second openings 37*b* of the second cladding layer 36 serve as flow paths, the underfill resin can permeate into the first opening 37*a* and the contact holes CH communicated with the second openings 37*b* by a capillary phenomenon.

Thus, as shown in FIGS. 11A to 11C, the first opening 37*a* and the second openings 37*b* of the second cladding layer 36 below the light emitting element 40 and also gaps between side surfaces of the contact holes CH and the connection terminals 42 of the light emitting element 40 communicated therewith are filled with the underfill resin 50.

In this way, the optical path conversion mirror M inside the first opening 37*a* of the second cladding layer 36 is sealed with the underfill resin 50.

In a plan view of FIG. 11C, the underfill resin 50 is filled in an obliquely hatched region. Also, as shown in FIG. 11C, in a portion of the light emitting element 40 which is in contact with the second cladding layer 36, the underfill resin 50 is left on both outer sides of the light emitting element 40.

Thus, in the present embodiment, even if the light emitting element 40 is mounted in a state where the lower surface thereof is in contact with the upper surface of the second cladding layer 36, parts of the second openings 37*b* of the second cladding layer 36 communicated with the contact holes CH are kept exposed outside the light emitting element 40.

Accordingly, the underfill resin 50 can be easily filled into the contact holes CH below the light emitting element 40 through the second openings 37*b* of the second cladding layer 36.

In this way, the optical waveguide device 1 of the embodiment as shown in FIGS. 11A to 11C is obtained.

As shown in FIGS. 11A and 11B, the optical waveguide device 1 of the embodiment has the wiring board 10 described in FIG. 2A as described above. The optical waveguide 30 is formed on the wiring board 10.

The optical waveguide 30 is formed by the first cladding layer 32, the core layers 34 formed thereon and the second cladding layer 36 covering the core layers 34, and thus has a structure in which the core layers 34 are surrounded by the first and second cladding layers 32 and 36. A refractive index of the core layers 34 is set to be higher than refractive indexes of the first and second cladding layers 32 and 36.

Also, the optical path conversion mirror M formed of a light reflective metal is arranged on an end of each core layer 34 of the optical waveguide 30.

As shown in FIGS. 11B and 11C, the contact holes CH are formed in the second cladding layer 36 and the first cladding layer 32 to reach the respective connection pads P of the wiring layer 20. Also, the opening 37 is formed on the second cladding layer 36.

The opening 37 of the second cladding layer 36 is formed by the first opening 37*a* arranged above a region including the optical path conversion mirror M of the optical waveguide 30, and the second openings 37*b* connected to both ends thereof.

The second openings 37*b* of the second cladding layer 36 are formed in regions including the respective connection pads P and are communicated with the respective contact holes CH. Also, the second openings 37*b* of the second cladding layer 36 are formed in an elongated rectangular shape extending in the same direction as an extension direction of the core layer 34.

Further, the connection terminals 42 of the light emitting element 40 are arranged in the respective contact holes CH and are connected to the respective connection pads P of the wiring layer 20 via solders 46. The light emitting element 40 has the light emitting portion 44 formed to protrude from the lower surface thereof.

An area of the first opening 37*a* of the second cladding layer 36 is set to be larger than an area of the light emitting portion 44 of the light emitting element 40. Also, a depth of the first opening 37*a* of the second cladding layer 36 is set to be deeper than a protruding height of the light emitting portion 44 of the light emitting element 40.

Also, the protruding light emitting portion 44 of the light emitting element 40 is received in the first opening 37*a* of the second cladding layer 36 and thus is not in contact with the second cladding layer 36.

A length of the second openings 37*b* of the second cladding layer 36 is set to be longer than a width of the light emitting element 40. Thus, parts of the second openings 37*b* of the second cladding layer 36 extend outward relative to both outer sides of the light emitting element 40 and thus are exposed outside thereof.

In this way, at least one end of the light emitting element 40 is positioned above the second openings 37*b* of the second cladding layer 36.

Also, a height of the connection terminals 42 of the light emitting element 40 is set to be lower than a height as measured from a surface of the connection pad P, which is located on the bottom of the contact hole CH, to the top end of the second opening 37*b* of the second cladding layer 36. Accordingly, the lower surface of the light emitting element 40 is in contact with the upper surface of the second cladding layer 36 so that a height position of the light emitting element 40 can be defined, thereby achieving an optimal parallelization.

Further, as shown in FIGS. 11B and 11C, the first opening 37*a* and the second openings 37*b* of the second cladding layer 36 and also gaps between side walls of the contact holes CH and the connection terminals 42 of the light emitting element 40 communicated therewith are filled with the underfill resin 50 for sealing below the light emitting element 40.

As the light emitting element 40, a surface emitting laser (i.e., VCSEL: Vertical Cavity Surface Emitting Laser) is suitably employed. Also, if a light receiving element is used as the optical element, a photo diode is suitably employed.

Also, the light emitting portion 44 of the light emitting element 40 is optically coupled to the optical path conversion mirror M. Alternatively, if a light receiving element is used as the optical element, a light receiving portion formed to protrude from a lower surface of the light receiving element is optically coupled to the optical path conversion mirror M.

As described above, the optical waveguide device 1 of the embodiment is configured so that the protruding light emitting portion 44 of the light emitting element 40 is received in the first opening 37*a* of the second cladding layer 36. Accordingly, the problem that the light emitting portion 44 of the light emitting element 40 pushes down the second cladding layer 36 so that the optical path conversion mirror M is deformed is solved.

Thus, a higher reliability in optical coupling between the light emitting element 40 and the optical path conversion mirror M can be ensured.

Also, the light emitting portion 44 of the light emitting element 40 comes closer to the optical path conversion mirror M by the height thereof protruding from the main body, thereby enhancing optical characteristics.

Further, when the light emitting element 40 is connected to the connection pads P by means of reflow heating, the light emitting portion 44 of the heated light emitting element 40 does not come in contact with the second cladding layer 36. Accordingly, deterioration of the optical path conversion mirror M due to influence of heat from the light emitting element 40 is prevented.

Further, the underfill resin 50 is filled into the contact holes CH through the second openings 37b of the second cladding layer 36 which are arranged outside the light emitting element 40 and thus serve as flow paths.

Because the second openings 37b of the second cladding layer 36 are communicated with the respective contact holes CH, the underfill resin 50 can be reliably filled into all contact holes CH.

Thus, even if a heating treatment is subsequently performed, expansion of air is not occurred inside the contact holes CH and thus reliability in electrical connection between the light emitting element 40 and the connection pads P of the wiring board 10 can be ensured.

Also, because the lower surface of the light emitting element 40 is abutted against the upper surface of the optical waveguide 30 when the light emitting element 40 is mounted thereon, an optimized height or parallelization thereof can be easily achieved, thereby enhancing optical characteristics.

Figure 12:
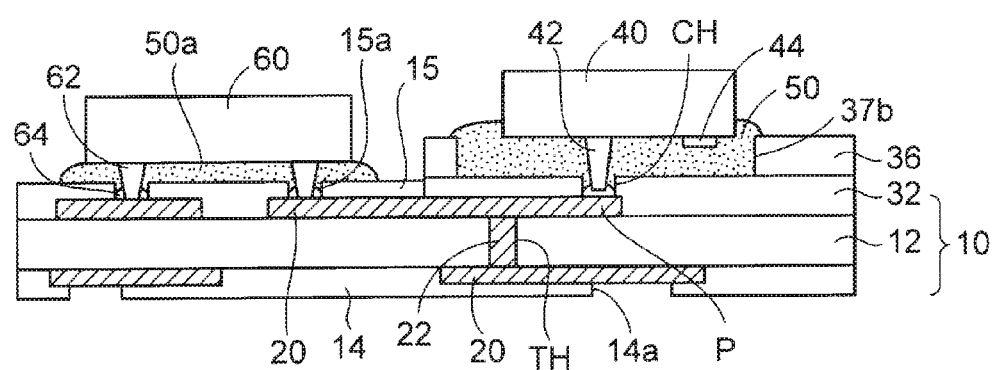
FIG. 12 is a sectional view showing a state where a control element is connected to a light emitting element of FIGS. 11A to 11C.

In FIG. 12, a state where a control element 60 is connected to the light emitting element 40 of FIG. 11A is shown. As shown in FIG. 12, a solder resist layer 15 provided with openings 15a above connection portions of the wiring layer 20 is formed on the wiring board 10 in a direction transverse to the light emitting element 40.

Also, connection terminals 62 of the control element 60 are connected to the connection portions of the wiring layer 20 via solders 64. Also, an underfill resin 50a is filled below the control element 60.

In this way, the light emitting element 40 is electrically connected to the control element 60 via the wiring layer 20 of the wiring board 10.

Next, light propagation of the optical waveguide apparatus 1 of the embodiment will be described with reference to FIGS. 11A to 12. In FIG. 12, if the light emitting element 40 is used as the optical element, the control element 60 is arranged as a driver element. Then, an electric signal outputted form the driver element is supplied to the light emitting element and thus light is emitted downward from the light emitting surface of the light emitting element.

The light emitted from the light emitting element 40 reaches the optical path conversion mirror M (FIG. 11A) after penetrating the underfill resin 50. Also, the light is reflected on the optical path conversion mirror M to be 90°-converted in optical path and then is incident to the core layer 34.

The light incident to the core layer 34 propagates while being repeatedly totally reflected in the core layer 34 and then is 90°-converted in optical path by an optical path conversion mirror M on the other end side to be incident to a light receiving portion of a light receiving element.

On the other hand, if a light receiving element is used as the optical element, the control element 60 is arranged as an amplifier element. In this case, light propagates in a direction opposite to the above optical path and then is incident to a light receiving portion of the light receiving element.

Also, the light receiving element converts the optical signal to an electric signal and then supplies the electric signal to the amplifier element.

Other Embodiments

Figure 13:
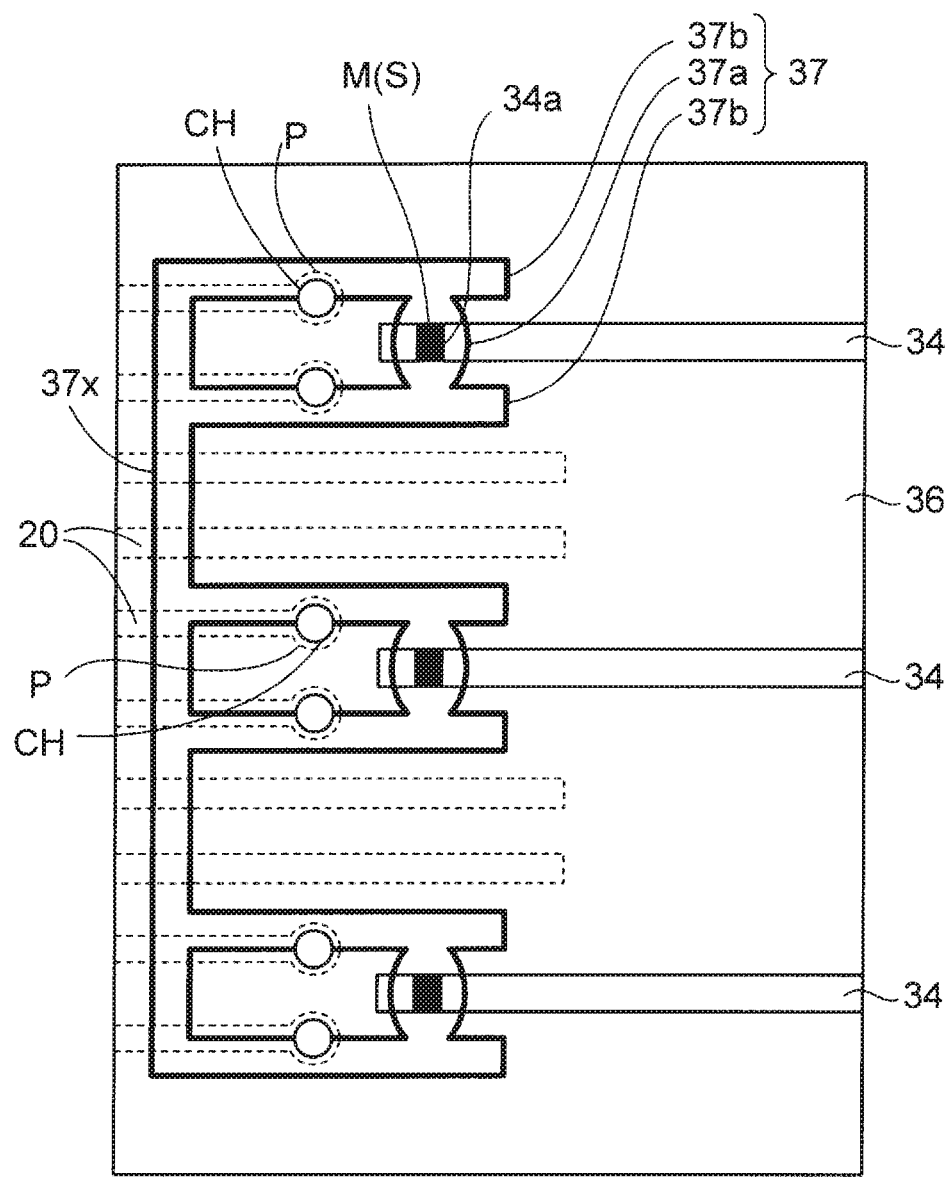
FIG. 13 is a plan view showing a first modified example of an opening of a second cladding layer in the optical waveguide device according to the embodiment.
Figure 14:
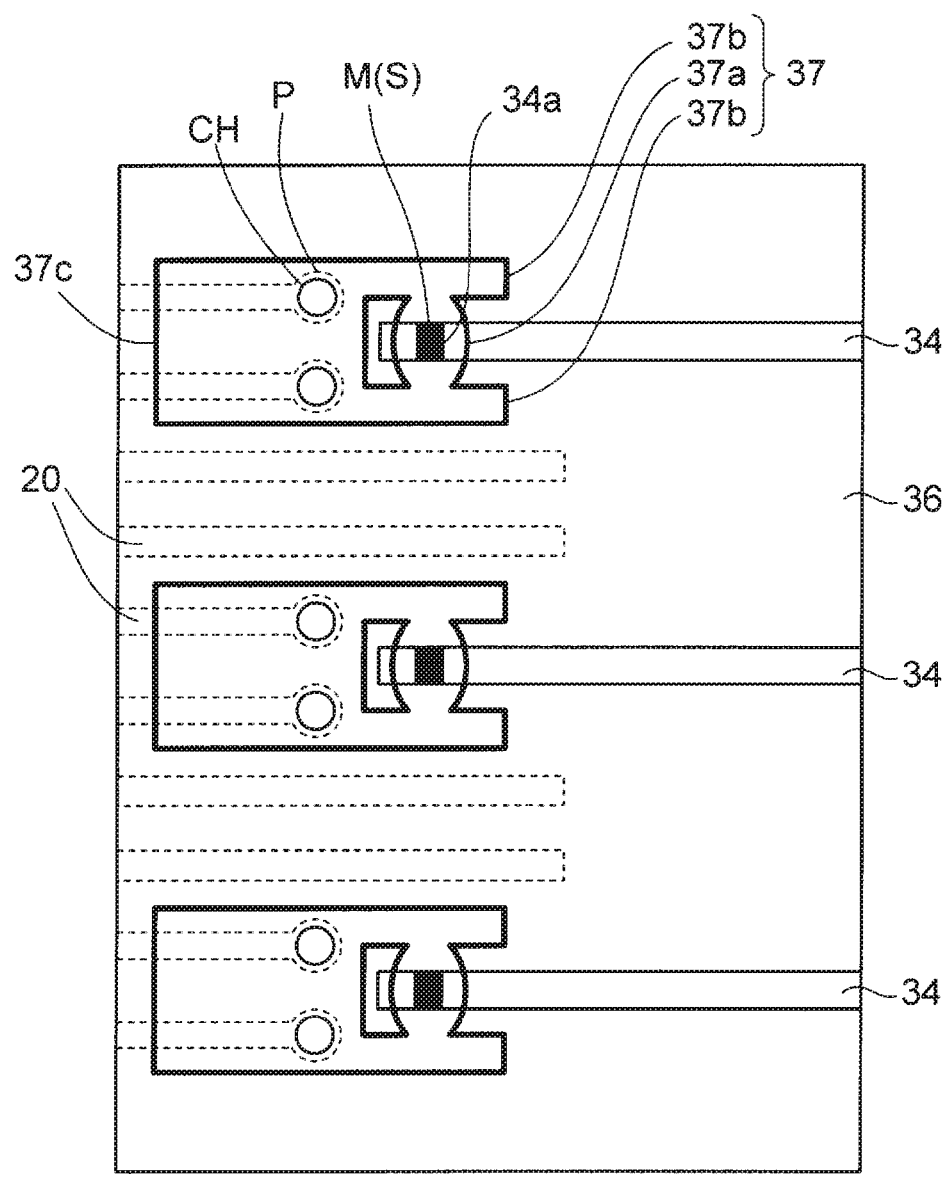
FIG. 14 is a plan view showing a second modified example of the opening of the second cladding layer in the optical waveguide device according to the embodiment.

FIGS. 13 and 14 are plan views showing modified examples of the first opening 37a and the second openings 37b of the second cladding layer 36 of FIGS. 7A to 7C as described above. In FIGS. 7A to 7C as described above, two second openings 37b connected to both ends of the first opening 37a of the second cladding layer 36 are arranged to be separated from other second openings 37a.

As shown in a first modified example of FIG. 13, one end of each second opening 37b of the second cladding layer 36 of FIGS. 7A to 7C may be connected with a common opening 37x, so that all first openings 37a, all second openings 37b and all contact holes CH are communicated with each other.

Also, as shown in a second modified example of FIG. 14, two second openings 37b connected to both ends of the first opening 37a may be connected to a third opening 37c arranged to cover a region including two contact hole CH. In this case, all of two contact holes CH are arranged in one third opening 37c of the second cladding layer 36 and thus the contact holes CH are formed in only the first cladding layer 32.

In this way, the first opening 37a and the second openings 37b of the second cladding layer 36 are sufficient so long as being arranged in a region including the optical path conversion mirror M and also being communicated with the contact holes CH without interfering with the optical waveguide 30, and accordingly may be employed in various shapes.

Because the second openings 37b of the second cladding layer 36 are communicated with the contact holes CH, the underfill resin 50 can be filled into the first opening 37a and the contact holes CH using the second openings 37b of the second cladding layer 36 as flow paths.

Figure 15:
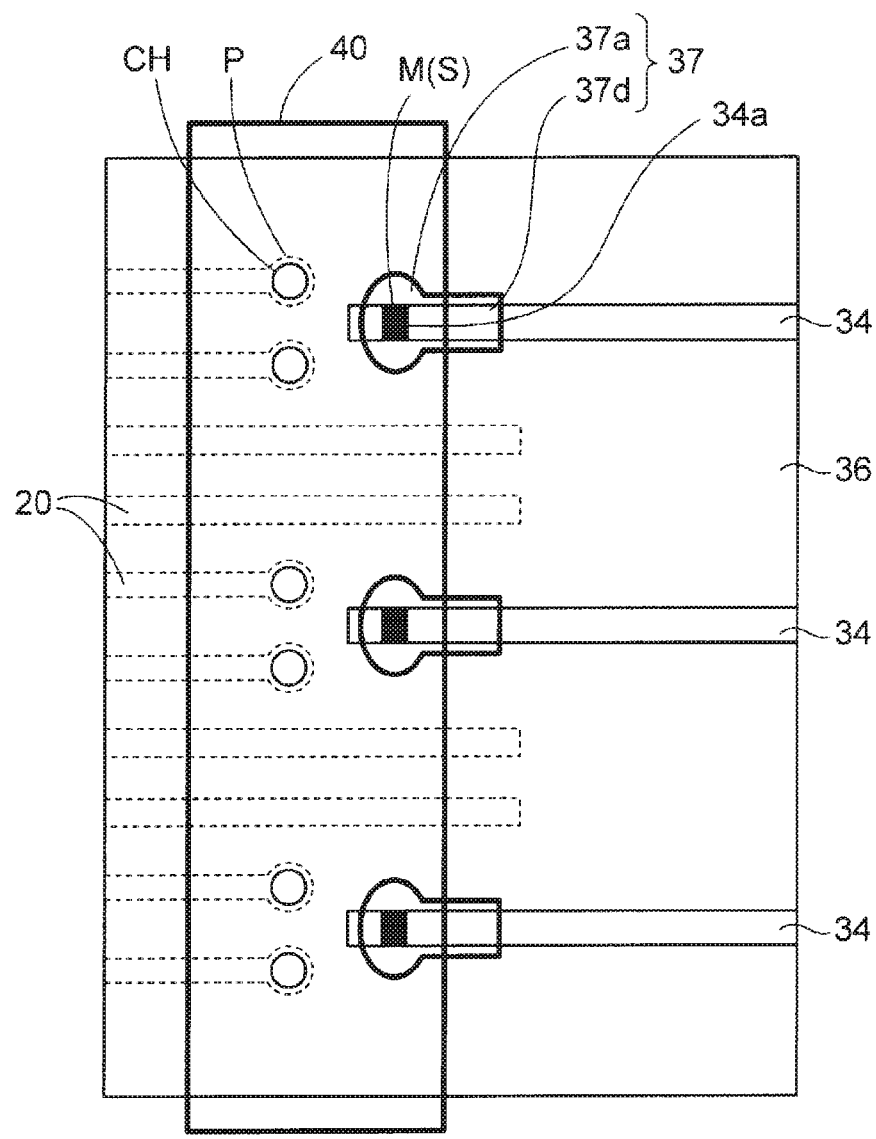
FIG. 15 is a plan view showing another example of the opening of the second cladding layer in the optical waveguide device according to the embodiment.

In FIG. 15, another example of the opening of the second cladding layer is shown. As shown in FIG. 15, if the underfill resin 50 does need to filled in the contact holes CH, the second openings 37b connected to the first opening 37a of the second cladding layer 36 and communicated with the contact holes CH may be omitted.

In the case of this example, an opening 37 formed in the second cladding layer 36 is formed by a first elliptical opening 37a arranged above a region including the optical path conversion mirror M of the core layer 34 and a fourth rectangular opening 37d connected to the first opening 37a and extending in an extension direction of the core layer 34.

Also, similarly, after the light emitting element 40 is mounted, a part of the fourth opening 37d of the second cladding layer 36 is exposed outside the light emitting element 40. Also, an underfill resin is filled into the first opening 37a through the exposed part of the fourth opening 37d.

Also in the case of the example, a resin may be filled in the contact holes CH in such a manner that a resin is previously applied in the contact holes CH and then connection terminals of the light emitting element are connected to connection pads via the resin.

(Other Manufacturing Methods)

In the step of FIGS. 6A to 6C as described above, the opening 37 is formed in the second cladding layer 36 on the basis of photolithography. Instead of this method, as shown in FIG. 16A, a second cladding layer 36 may be formed of a non-photosensitive resin and then a concave opening 37 may be formed by laser.

In this case, laser is irradiated by a surface emitting laser via a mask provided with openings corresponding to a plurality of openings 37 of the second cladding layer 36. Thus, the plurality of openings 37 can be formed all at once by the laser processing.

Figure 16A:
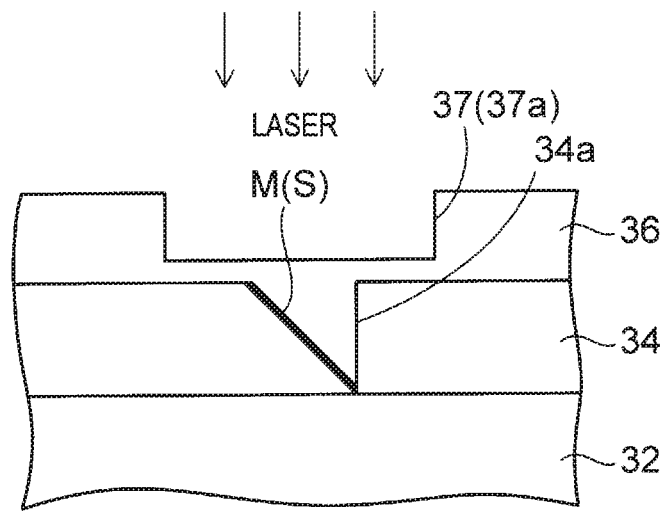
FIGS. 16A and 16B are sectional views showing an example where the opening of the second cladding layer in the optical waveguide device according to the embodiment is formed by laser.

In the case where the openings 37 are formed in the second cladding layer 36 by laser, as shown in FIG. 16A, the openings 37 are formed to have a concave shape extending to a middle of a thickness of the second cladding layer 36. A depth of the openings 37 of the second cladding layer 36 is set to be deeper than a protruding height of the light emitting portion 44 of the light emitting element 40.

The second cladding layer 36 is left in the cutout portion 34a of the core layer 34 so that the optical path conversion mirror NI is covered with the second cladding layer 6.

Also, a thin film of the second cladding layer 36 is left on a bottom of the opening 37 of the second cladding layer 36 located above the core layer 34.

Figure 16B:
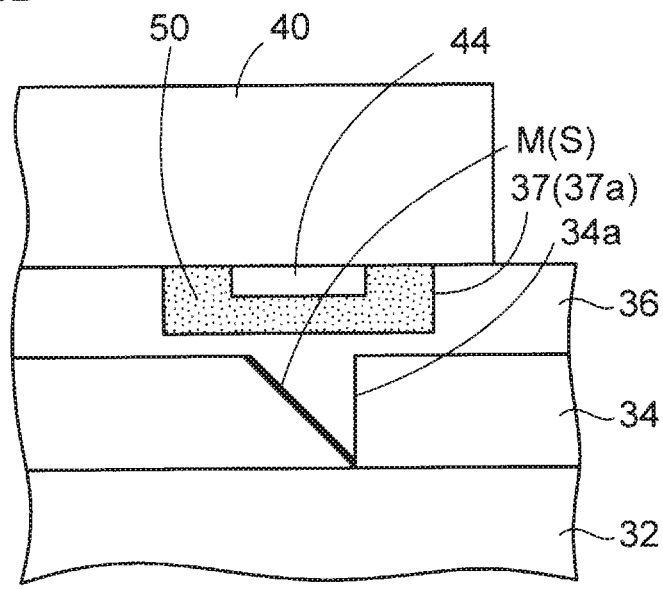

In addition, as shown in FIG. 16B, the underfill resin 50 is filled in the opening 37 of the second cladding layer 36 after the light emitting element 40 is mounted on the second cladding layer 36, in the same manner as the steps of FIGS. 9A to 11C.

The structure of FIG. 16B is advantageous in terms of reliability because the optical path conversion mirror M of the optical waveguide 30 is protected by the second cladding layer 36 and thus is not in contact with the underfill resin 50.

[Clauses]

This disclosure further encompasses various exemplary embodiments, for example, described below.

1. A method of manufacturing an optical waveguide device, comprising:

preparing a wiring board;

forming a first cladding layer on the wiring board;

forming a core layer on the first cladding layer;

forming an optical path conversion mirror on the core layer;

forming a second cladding layer having an opening above the optical path conversion mirror on the first cladding layer and the core layer;

preparing an optical element having a light emitting portion or light receiving portion protruding from a lower side thereof, and mounting the optical element on the second cladding layer so that the light emitting portion or light receiving portion is arranged inside the opening of the second cladding layer and also at least one end of the optical element is positioned above the opening.

2. The method according to claim 1, further comprising filling an underfill resin into the opening of the second cladding layer.

3. The method according to claim 2, wherein the wiring board has a connection pad on an upper surface thereof, wherein in the forming the second cladding layer, the opening is formed to extend from a region above the optical path conversion mirror to a region above the connection pad;

wherein the method further comprises forming a hole to reach the connection pad after the forming the second cladding layer;

wherein in the mounting the optical element, a connection terminal of the optical element is connected to the connection pad inside the hole;

wherein in the filling the underfill resin, the underfill resin is filled into the hole through the opening of the second cladding layer.

4. The method according to any one of claims 1 to 3, wherein in the mounting the optical element, a lower surface of the optical element, except the light emitting portion or light receiving portion, is abutted against an upper surface of the second cladding layer of the optical waveguide.

5. The method according to any one of claims 1 to 4, further comprising:

mounting a control element on the wiring board to be electrically connected to the optical element, wherein the optical element is a light emitting element or light receiving element.

What is claimed is:

1. An optical waveguide device, comprising:
a wiring board;
an optical waveguide having a first cladding layer, a core layer and a second cladding layer formed in this order on the wiring board;
an optical path conversion mirror formed in the core layer; and
an optical element mounted on the second cladding layer, the optical element comprising a light emitting portion or a light receiving portion protruding from a lower side thereof,
wherein the second cladding layer has an opening formed above the optical path conversion mirror,
wherein the optical element is mounted on the second cladding layer so that at least one end thereof is positioned above the opening of the second cladding layer,
wherein the light emitting portion or light receiving portion of the optical element is arranged inside the opening of the second cladding layer,
wherein the wiring board has a connection pad formed on an upper surface thereof,
wherein the first cladding layer has a hole formed above the connection pad to expose the connection pad therefrom,
wherein the opening formed in the second cladding layer comprises a first opening formed in a region above the optical path conversion mirror and a second opening connected to the first opening and communicated with the hole, and
wherein a connection terminal of the optical element is connected to the connection pad inside the hole and an underfill resin is filled in the opening of the second cladding layer and also in the hole.

2. The optical waveguide device according to claim 1, wherein a lower surface of the optical element, except the light emitting portion or light receiving portion, is in contact with an upper surface of the second cladding layer of the optical waveguide.

3. The optical waveguide device according to claim 1, further comprising:
a control element provided on the wiring board to be electrically connected to the optical element,
wherein the optical element is a light emitting element or light receiving element.

* * * * *